(12) United States Patent
Zong (10) Patent No.: US 12,262,503 B1
(45) Date of Patent: Mar. 25, 2025

(54) HEAT DISSIPATION DEVICE AND SERVER (71) Applicant: SUZHOU METABRAIN INTELLIGENT TECHNOLOGY CO., LTD., Jiangsu (CN)

(72) Inventor: Bin Zong, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/846,241

(22) PCT Filed: Jun. 20, 2023

(86) PCT No.: PCT/CN2023/101431
§ 371 (c)(1),
(2) Date: Sep. 11, 2024

(87) PCT Pub. No.: WO2024/119767
PCT Pub. Date: Jun. 13, 2024

(30) Foreign Application Priority Data

Dec. 5, 2022 (CN) .......................... 202211550247.1

(51) Int. Cl.
*H05K 7/20* (2006.01)
(52) U.S. Cl.
CPC ..... *H05K 7/20145* (2013.01); *H05K 7/20727* (2013.01)
(58) Field of Classification Search
CPC ... G06F 1/20; G06F 1/206; G06F 1/26; G06F 1/181; H05K 7/20727; H05K 7/20145; H05K 7/20154; H05K 7/20136; H05K 7/20172; H01L 23/467; F28F 13/00; F28F 13/12; F28D 2021/0028
(Continued)

(56) References Cited

U.S. PATENT DOCUMENTS 6,525,935 B2 * 2/2003 Casebolt ............ H05K 7/20736
361/679.48
7,382,116 B2 * 6/2008 Endo ....................... G05F 1/618
327/112

(Continued)

FOREIGN PATENT DOCUMENTS

CN 101014236 A 8/2007
CN 203397297 U 1/2014
(Continued)

*Primary Examiner* — Mandeep S Buttar
(74) *Attorney, Agent, or Firm* — IPro, PLLC (57) ABSTRACT

A heat dissipating device includes a front-placed air duct (1) and a rear-placed air duct (2) that are sequentially arranged in the direction of the heat dissipating gas flow of the heat dissipating device and are communicated. First heat dissipating elements (4) and second heat dissipating elements (5) are located in different front-placed air sub-ducts (3) of the front-placed air duct (1), the heat-dissipation amount of the first heat dissipating elements (4) is greater than that of the second heat dissipating elements (5), and a blocking plate (6) is provided within a front-placed air sub-duct (3) and used for reducing the magnitude of the heat dissipating gas flow of the front-placed air sub-duct (3). A third heat dissipating element (7) is provided inside the rear-placed air duct (2), and a flow guiding hood (8) is provided between the front-placed air duct (1) and the rear-placed air duct (2).

23 Claims, 5 Drawing Sheets

(58) Field of Classification Search
USPC .......................................................... 361/695
See application file for complete search history.

(56) References Cited

U.S. PATENT DOCUMENTS

| | | | | |
|---|---|---|---|---|
| 9,075,581 | B2* | 7/2015 | Stock | H05K 7/20727 |
| 9,084,375 | B2* | 7/2015 | Hughes | H05K 7/20727 |
| 9,417,671 | B2* | 8/2016 | Farrow | G06F 1/20 |
| 9,871,358 | B2* | 1/2018 | Pawar | H02B 1/56 |
| 10,372,177 | B2* | 8/2019 | Kurosaki | H05K 7/20727 |
| 11,058,034 | B2* | 7/2021 | Leung | H05K 7/1492 |
| 2005/0041392 | A1 | 2/2005 | Chen | |
| 2014/0073234 | A1* | 3/2014 | Elison | H05K 7/20727 |
| | | | | 361/695 |
| 2019/0045659 | A1* | 2/2019 | Donachy | H05K 7/20727 |
| 2019/0116689 | A1* | 4/2019 | Chen | H05K 7/20154 |
| 2022/0361362 | A1* | 11/2022 | Chen | G06F 1/20 |

FOREIGN PATENT DOCUMENTS

| | | |
|---|---|---|
| CN | 107024967 A | 8/2017 |
| CN | 206895102 U | 1/2018 |
| CN | 109407797 A | 3/2019 |
| CN | 113099676 A | 7/2021 |
| CN | 216561694 U | 5/2022 |
| CN | 115395136 A | 11/2022 |
| CN | 115617143 A | 1/2023 |
| TW | 578993 U | 3/2004 |

\* cited by examiner

HEAT DISSIPATION DEVICE AND SERVER

CROSS-REFERENCE TO RELATED APPLICATION

The present application claims the priority of the Chinese patent application filed on Dec. 5, 2022 before the Chinese Patent Office with the application number of 202211550247.1 and the title of "HEAT DISSIPATION DEVICE AND SERVER", which is incorporated herein in its entirety by reference.

FIELD

The present application relates to the field of servers, and particularly relates to a heat dissipating device and a server.

BACKGROUND

With the development of new technologies such as cloud computing and big data, people are having increasingly higher requirements on the bandwidth and the capacity of data storage, and the computation speeds and the computation burdens of processors are increasingly higher. As a result, the temperatures of the component elements such as the internal memory, the hard disk and the network card continuously increase, and the heat dissipation of electronic devices has become a troublesome problem currently. Furthermore, presently the society is having increasingly higher requirements on power consumption, and energy saving is a mainstream trend currently. Presently, servers are having increasingly higher demands on hard disks, CPUs (Central Processing Unit) and network cards. With the increasing of the computation burden, correspondingly the requirement on the CPU performance is increasingly higher, and the power consumption of CPUs is also increasingly higher. For computers, the high-power-consumption CPU is a bottleneck for the heat-dissipation design of the entire machine.

Currently, the bottleneck for the heat dissipation of a server is the CPU, the rear-placed PSU (Power Supply Unit, or the power supply) and the rear-placed high-capacity network card (100G). Both of the PSU and the network card are located at the rear end of the crate. The heat dissipating gas flow firstly passes through the CPU, and subsequently performs the heat dissipation to the PSU and the network card. Therefore, the effect of heat dissipation at the PSU and the network card is poor, which very easily causes that the temperatures exceed the standard values, and the efficiency of the heat dissipation is extremely low.

SUMMARY

In view of the above, the present application provides a heat dissipating device and a server, to increase the coordinated heat-dissipation capacity of the heat dissipating device and the server.

In an aspect, there is provided a heat dissipating device, wherein the heat dissipating device comprises a front-placed air duct and a rear-placed air duct that are sequentially arranged in a direction of a heat dissipating gas flow of the heat dissipating device, and the rear-placed air duct and the front-placed air duct are communicated;

the front-placed air duct comprises a plurality of front-placed air sub-ducts, a plurality of first heat dissipating elements and second heat dissipating elements are provided inside the front-placed air duct, the first heat dissipating elements and the second heat dissipating elements are located in different instances of the front-placed air sub-ducts, a heat-dissipation amount of the first heat dissipating elements within a unit time is greater than a heat-dissipation amount of the second heat dissipating elements within the unit time, a blocking plate is provided within the front-placed air sub-duct corresponding to at least one of the second heat dissipating elements, the blocking plate has different specifications, and the blocking plates of different specifications have unequal cross-sectional areas inside the corresponding front-placed air sub-ducts; and a third heat dissipating element is provided inside the rear-placed air duct, the front-placed air sub-ducts that are closest to the third heat dissipating element are a first air sub-duct, a second air sub-duct and a third air sub-duct, a flow guiding hood is provided between the first air sub-duct, the second air sub-duct and the third air sub-duct on one hand and the rear-placed air duct on the other hand, the flow guiding hood comprises a flow guiding plate and a flow directing plate, the flow directing plate comprises a flow directing partition plate and a flow directing through plate, the heat dissipating gas flows in the first air sub-duct and the second air sub-duct are converged by the flow guiding plate and subsequently flow toward the third heat dissipating element in the rear-placed air duct via the flow directing through plate, and the heat dissipating gas flow of the third air sub-duct passes through the flow guiding plate, is diverted by the first air sub-duct and the second air sub-duct, and subsequently leaves the third heat dissipating element via the flow directing partition plate.

In some embodiments of the present application, the heat dissipating device further comprises a housing, a wind directing hood, a mainboard and the flow guiding hood are provided inside the housing, the mainboard comprises a first mainboard region and a second mainboard region, the front-placed air duct is formed between the first mainboard region on one hand and the wind directing hood and the housing on the other hand, the rear-placed air duct is formed between the second mainboard region on one hand and the flow guiding hood and the housing on the other hand, the plurality of first heat dissipating elements and second heat dissipating elements are provided within the first mainboard region, and the third heat dissipating element is provided within the second mainboard region.

In some embodiments of the present application, the wind directing hood comprises a top plate, a plurality of partition plates are provided on the top plate, the front-placed air sub-ducts are formed between two neighboring instances of the partition plates, and the blocking plates are detachably mounted inside the front-placed air sub-ducts.

In some embodiments of the present application, the blocking plate is connected to the top plate, and/or the blocking plate is connected to the partition plates on two sides of the front-placed air sub-duct corresponding thereto.

In some embodiments of the present application, a plurality of fourth heat dissipating elements are provided within the second mainboard region, the fourth heat dissipating elements are located in the rear-placed air duct, and the fourth heat dissipating elements correspond to at least one of the front-placed air sub-ducts.

In some embodiments of the present application, a specification of the blocking plate is decided according to a heat-dissipation demand of the fourth heat dissipating elements.

In some embodiments of the present application, an installation position of the blocking plate is decided according to positions of the fourth heat dissipating elements in the rear-placed air duct.

In some embodiments of the present application, the first heat dissipating elements are central processing units, the second heat dissipating elements are memory bars, and the blocking plate is provided inside the front-placed air sub-duct corresponding to at least one of the memory bars.

In some embodiments of the present application, the third heat dissipating element is a power-supply module, and the fourth heat dissipating elements are a south-bridge chip and an M.2 interface device.

In some embodiments of the present application, the heat dissipating device further comprises a fan member, a heat dissipating gas flow generated by the fan member flows into the front-placed air duct, and the first air sub-duct, the second air sub-duct and the third air sub-duct in the front-placed air duct correspond to the power-supply module.

In some embodiments of the present application, the flow guiding plate and the flow directing plate are hinged.

In some embodiments of the present application, a center line is formed between the second air sub-duct and the third air sub-duct, and the flow guiding plate is located in the center line.

In some embodiments of the present application, the flow directing partition plate and the flow directing through plate are located on two sides of the flow guiding plate, the flow directing partition plate is located on one side corresponding to the third air sub-duct, and the flow directing through plate is located on one side corresponding to the first air sub-duct and the second air sub-duct.

In some embodiments of the present application, a first guide plate is provided on one side of the flow directing through plate that is opposite to the flow guiding plate, and a first flow directing groove for changing the direction of the heat dissipating gas flow is formed between the first guide plate and the flow directing through plate.

In some embodiments of the present application, a second guide plate is provided on one side of the flow directing partition plate that is opposite to the flow guiding plate, and a second flow directing groove for changing the direction of the heat dissipating gas flow is formed between the second guide plate and the flow directing partition plate.

In some embodiments of the present application, the second flow directing groove and the first flow directing groove are communicated.

In some embodiments of the present application, cable raceways are provided at a top and a bottom of the flow guiding plate.

In some embodiments of the present application, foamed plastics are provided at the cable raceways, and threading grooves are provided on the foamed plastics.

In some embodiments of the present application, foamed plastics are provided between two sides of the wind directing hood and the housing, each of the foamed plastics is provided with a threading hole and an avoiding hole, and gaps of some of the threading holes and the avoiding holes form the first air sub-duct.

In another aspect, there is provided a server, wherein the server comprises the heat dissipating device.

BRIEF DESCRIPTION OF THE DRAWINGS

In order to more clearly illustrate the technical solutions of some embodiments of the present application, the figures that are required to describe the embodiments will be briefly described below. Apparently, the figures that are described below are merely embodiments of the present application, and a person skilled in the art can obtain other figures according to these figures without paying creative work.

DESCRIPTION OF THE REFERENCE NUMBERS OF THE DRAWINGS OF THE DESCRIPTION

1: front-placed air duct; 2: rear-placed air duct; 3: front-placed air sub-ducts; 4: first heat dissipating element; 5: second heat dissipating element; 6: blocking plate; 7: third heat dissipating element; 8: flow guiding hood; 9: outer shell; 10: wind directing hood; 11: mainboard; 12: first mainboard region; 13: second mainboard region; 14: top plate; 15: partition plates; 16: fourth heat dissipating elements; 17: fan member; 18: first air sub-duct; 19: second air sub-duct; 20: third air sub-duct; 21: flow guiding plate; 22: flow directing plate; 23: flow directing partition plate; 24: flow directing through plate; 25: first guide plate; 26: first flow directing groove; 27: second guide plate; 28: second flow directing groove; 29: cable raceways; 30: foamed plastics; 31: threading grooves; 32: threading holes; 33: avoiding holes; 34: side plates; 35: first power-supply module; and 36: second power-supply module.

DETAILED DESCRIPTION

In order to make the objects, the technical solutions and the advantages of the present application clearer, the present application will be described in further detail below with reference to the drawings and the embodiments. It should be understood that the particular embodiments described herein are merely intended to interpret the present application, and are not intended to limit the present application.

The First Embodiment

Referring to FIGS. 1-8, the heat dissipating device comprises a front-placed air duct 1 and a rear-placed air duct 2 that are sequentially arranged in the direction of the heat dissipating gas flow of the heat dissipating device, and the rear-placed air duct 2 and the front-placed air duct 1 are communicated. The front-placed air duct 1 comprises a plurality of front-placed air sub-ducts 3, a plurality of first heat dissipating elements 4 and second heat dissipating elements 5 are provided inside the front-placed air duct 1, the first heat dissipating elements 4 and the second heat dissipating elements 5 are located in different front-placed air sub-ducts 3, the heat-dissipation amount of the first heat dissipating elements 4 within a unit time is greater than the heat-dissipation amount of the second heat dissipating elements 5 within the unit time, a blocking plate 6 is provided within the front-placed air sub-duct 3 corresponding to at least one of the second heat dissipating elements 5, the blocking plate 6 has different specifications, and the blocking plates 6 of different specifications have unequal cross-sectional areas inside the corresponding front-placed air sub-ducts 3. A third heat dissipating element 7 is provided inside the rear-placed air duct 2, the front-placed air sub-ducts 3 that are closest to the third heat dissipating element 7 are a first air sub-duct 18, a second air sub-duct 19 and a third air sub-duct 20, a flow guiding hood 8 is provided between the first air sub-duct 18, the second air sub-duct 19 and the third air sub-duct 20 on one hand and the rear-placed air duct 2 on the other hand, the flow guiding hood 8 comprises a flow guiding plate 21 and a flow directing plate 22, the flow directing plate 22 comprises a flow directing partition plate 23 and a flow directing through plate 24, the heat dissipating gas flows in the first air sub-duct 18 and the second air sub-duct 19 are converged by the flow guiding plate 21 and subsequently flow toward the third heat dissipating element 7 in the rear-placed air duct 2 via the flow directing through plate 24, and the heat dissipating gas flow of the third air sub-duct 20 passes through the flow guiding plate 21, is diverted by the first air sub-duct 18 and the second air sub-duct 19, and subsequently leaves the third heat dissipating element 7 via the flow directing partition plate 23.

In order to increase the coordinated heat-dissipation capacity of the heat dissipating device, in the present application the flowing path of the heat dissipating gas flow inside the heat dissipating device is optimized, to increase the overall heat-dissipation capacity of the heat dissipating device, and further increase the heat-dissipation capacity for the heat dissipating elements located behind the CPU, whereby all of the temperatures of the component elements inside the heat dissipating device may be effectively controlled within the standards. The power source of the heat dissipating device is a fan member 17, and the fan member 17 generates a heat dissipating gas flow. A front-placed air duct 1 and a rear-placed air duct 2 are sequentially arranged in the flowing direction of the heat dissipating gas flow, and the front-placed air duct 1 and the rear-placed air duct 2 are communicated. Therefore, the heat dissipating gas flow generated by the fan member 17 passes through the front-placed air duct 1 and subsequently passes through the rear-placed air duct 2. A first heat dissipating element 4 and a second heat dissipating element 5 are provided inside the front-placed air duct 1, the front-placed air duct 1 comprises a plurality of front-placed air sub-ducts 3, and the first heat dissipating element 4 and the second heat dissipating element 5 are located in different front-placed air sub-ducts 3. In comparison between the first heat dissipating element 4 and the second heat dissipating element 5, the heat-dissipation amount of the first heat dissipating element 4 is greater than the heat-dissipation amount of the second heat dissipating element 5. A blocking plate 6 is provided in the front-placed air sub-duct 3 where the second heat dissipating element 5 (the heat dissipating element having the lower demand on the heat-dissipation amount) is located, so as to reduce, by using the blocking plate 6, the magnitude of the heat dissipating gas flow within a unit time of the front-placed air sub-duct 3 where it is located. In the same one front-placed air duct 1, the reduction of the magnitude of the heat dissipating gas flow passing through the second heat dissipating element 5 results in the increasing of the heat dissipating gas flow passing through the first heat dissipating element 4. Therefore, the provision of the blocking plate 6, in fact, reduces part of the heat-dissipation capacity for the second heat dissipating element 5, so as to relatively increase the heat-dissipation capacity for the first heat dissipating element 4, which, while ensuring satisfaction of the heat-dissipation demand of the second heat dissipating element 5, coordinately optimizes the heat-dissipation capacity of the entire heat dissipating device, whereby all of the component elements in the heat dissipating device may be within the design standards, to satisfy the demands of the users. In comparison between the first heat dissipating element 4 and the second heat dissipating element 5, the first heat dissipating element 4 has a higher heat-dissipation demand, and the second heat dissipating element 5 has a lower heat-dissipation demand, whereby the overall heat-dissipation effect of the heat dissipating device may be optimized by compromising the heat-dissipation capacity for the second heat dissipating element 5. In order to further increase the efficiency of blocking of the blocking plate 6, the blocking plate 6 is provided with different specifications, wherein the blocking plates 6 of different specifications have unequal cross-sectional areas inside the corresponding front-placed air sub-ducts 3, and the unequal cross-sectional areas have different effects of blocking of the heat dissipating gas flows. Further, the blocking plate 6 having a higher cross-sectional area, inside the same one front-placed air sub-duct 3, has a higher resistance to the heat dissipating gas flow, and the blocking plate 6 having a lower cross-sectional area, inside the same one front-placed air sub-duct 3, has a lower resistance to the heat dissipating gas flow. Therefore, the blocking plates 6 of unequal cross-sectional areas may be provided to regulate the flow resistances by the blocking plates 6 to the heat dissipating gas flows inside the front-placed air sub-ducts 3 where the blocking plates 6 are located. Because the provision of the blocking plate 6, in fact, serves to block, by the blocking plate 6, the heat dissipating gas flow of the front-placed air sub-duct 3 where the blocking plate 6 is located, i.e., while ensuring satisfaction of the heat-dissipation demand of the second heat dissipating element 5, compromising part of the heat-dissipation capacity for the second heat dissipating element 5, so as to relatively increase the heat-dissipation capacity for the first heat dissipating element 4, the provision of the blocking plates 6 of different specifications may adjust the flow resistances by the blocking plates 6 to the heat dissipating gas flows inside the front-placed air sub-ducts 3 where the blocking plates 6 are located, so as to further increase the heat-dissipation capacity for the first heat dissipating element 4. A third heat dissipating element 7 is provided inside the rear-placed air duct 2. After the heat dissipating gas flow generated by the fan member 17 has passed through the front-placed air duct 1, the temperature of the heat dissipating gas flow has been increased, and the heat dissipating gas flow entering the rear-placed air duct 2 has already had a certain temperature. Therefore, in the related art, the heat-dissipation capacity for the third heat dissipating element 7 by the heat dissipating gas flow passing through the rear-placed air duct 2 cannot satisfy the heat-dissipation demand of the third heat dissipating element 7. Therefore, the flow guiding hood 8 is provided between the front-placed air duct 1 and the rear-placed air duct 2, and the path of the heat dissipating gas flow of the front-placed air duct 1 and the rear-placed air duct 2 and the magnitude of the heat dissipating gas flow passing through that path are reasonably coordinately planned by using the flow guiding hood 8, so as to increase the heat-dissipation capacity of the heat dissipating gas flow to the third heat dissipating element 7 located in the rear-placed air duct 2, to satisfy the heat-dissipation demand of the third heat dissipating element 7. Further, the path planning of the front-placed air duct 1 is realized by using a first air sub-duct 18, a second air sub-duct 19 and a third air sub-duct 20, wherein the front-placed air sub-ducts 3 that are closest to the third heat dissipating element 7 are the first air sub-duct 18, the second air sub-duct 19 and the third air sub-duct 20, and the path planning of the rear-placed air duct 2 is realized by using the flow guiding hood 8. The flow guiding hood 8 is provided between the front-placed air duct 1 and the rear-placed air duct 2, i.e., between the first air sub-duct 18, the second air sub-duct 19 and the third air sub-duct 20 on one hand and the third heat dissipating element 7 on the other hand. The heat dissipating gas flow generated by the fan member 17 is diverted by the first air sub-duct 18, the second air sub-duct 19 and the third air sub-duct 20 of the front-placed air duct 1, and passes through the front-placed air duct 1. In other words, the heat dissipating gas flow that has passed through the first air sub-duct 18, the second air sub-duct 19 and the third air sub-duct 20 passes through the flow guiding hood 8 to be diverted and converged, and subsequently flows into the rear-placed air duct 2. Further, as shown by the schematic diagram of the flowing directions of the heat dissipating gas flows in FIG. 3, part of the heat dissipating gas flow generated by the fan member 17 flows through the first air sub-duct 18 closest to the housing 9 of the server, part of the heat dissipating gas flow generated by the fan member 17 flows through the second air sub-duct 19 where the memory bar is located, and part of the heat dissipating gas flow generated by the fan member 17 flows through the third air sub-duct 20 where the central processing unit is located. The heat dissipating gas flow of the first air sub-duct 18 has the lowest temperature, the heat dissipating gas flow of the second air sub-duct 19 has a certain temperature rise, and the heat dissipating gas flow of the third air sub-duct 20 has a higher temperature rise. Therefore, the flow guiding hood 8 converges the heat dissipating gas flows of the first air sub-duct 18 and the second air sub-duct 19, so as to reduce the temperature of the heat dissipating gas flow of the second air sub-duct 19 by mixing the heat dissipating gas flow of the first air sub-duct 18 and the heat dissipating gas flow of the second air sub-duct 19. Furthermore, the flow guiding hood 8 diverts the converged flow of the first air sub-duct 18 and the second air sub-duct 19 from the heat dissipating gas flow of the third air sub-duct 20, so that the major part of the heat dissipating gas flow having a higher temperature rise flows toward the region of fourth heat dissipating elements 16 within a second mainboard region 13 (merely a small part of the heat dissipating gas flow having a higher temperature rise, via the gap between the flow guiding hood 8 and the housing, flows toward the third heat dissipating element, i.e., a power-supply module), rather than directly flowing toward the heat dissipating region of the power-supply module. Therefore, the path planning to the rear-placed air duct 2 by the flow guiding hood 8 is essentially compromising of part of the heat-dissipation capacity for the fourth heat dissipating elements 16, so as to increase the heat-dissipation capacity for the third heat dissipating element 7. By the path planning, the temperature of a first power-supply module 35 (closer to the housing 9 of the server) is increased, but still may be controlled within the standard, and a second power-supply module 36 (closer to the central processing unit), which has always exceeded the standard, may be controlled within the standard. The rear-placed air duct 2 after the path planning effectively solves the heat-dissipation capacity for the third heat dissipating element 7 (the power-supply module). The experimentation data are as follows. The third heat dissipating element 7 is the power-supply module, and the power-supply module comprises the first power-supply module 35 and the second power-supply module 36. Before the path planning, the temperature of the first power-supply module 35 is 39° C., and the temperature of the second power-supply module 36 is 58° C. After the path planning according to the present application has been employed, the temperature of the first power-supply module 35 is 42° C., and the temperature of the second power-supply module 36 is 51° C. (the standard is 55° C.). Therefore, the rear-placed air duct 2 after the path planning effectively solves the heat-dissipation capacity for the power-supply module. Accordingly, it can be seen that the provision of the blocking plate 6 in the front-placed air duct 1, the path planning of the front-placed air duct 1, and the path planning of the rear-placed air duct 2 by the flow guiding hood 8 serve to coordinately optimize the heat dissipation by the heat dissipating device overall, so that all of the component elements of a mainboard 11 may satisfy the standard requirements.

In the present application, the path of the front-placed air duct 1 and the rear-placed air duct 2 and the magnitude of the gas flow flowing through the front-placed air duct 1 and the rear-placed air duct 2 are coordinately planned. Firstly, the blocking plate 6 is provided in the front-placed air sub-duct 3 corresponding to the second heat dissipating element 5, so as to relatively increase the heat-dissipation capacity for the first heat dissipating element 4 by compromising the heat-dissipation capacity for the second heat dissipating element 5, which coordinately optimizes the heat-dissipation capacity of the front-placed air duct 1. The flow guiding hood 8 is provided between the front-placed air duct 1 and the rear-placed air duct 2, and the flow guiding hood 8 effectively converges and diverts the heat dissipating gas flow entering the rear-placed air duct 2 from the front-placed air duct 1, which coordinately optimizes the heat-dissipation capacity of the rear-placed air duct 2. The coordinated planning of the path of the front-placed air duct 1 and the rear-placed air duct 2 and the magnitude of the gas flow flowing through the front-placed air duct 1 and the rear-placed air duct 2 reduces the temperature of the third heat dissipating element 7 overall, and effectively increases the overall coordinated heat-dissipation capacity of the heat dissipating device.

In an embodiment of the present application, the heat dissipating device further comprises a housing 9, a wind directing hood 10, a mainboard 11 and the flow guiding hood 8 are provided inside the housing 9, the mainboard 11 comprises a first mainboard region 12 and a second mainboard region 13, the front-placed air duct 1 is formed between the first mainboard region 12 on one hand and the wind directing hood 10 and the housing 9 on the other hand, the rear-placed air duct 2 is formed between the second mainboard region 13 on one hand and the flow guiding hood 8 and the housing 9 on the other hand, the rear-placed air duct 2 and the front-placed air duct 1 are communicated, the plurality of first heat dissipating elements 4 and second heat dissipating elements 5 are provided within the first mainboard region 12, and the third heat dissipating element 7 is provided within the second mainboard region 13.

The heat dissipating device further comprises the housing 9 (the heat dissipating device is separately provided with the housing 9, or the housing 9 of the server serves as the housing 9 of the heat dissipating device). The housing 9 serves to protect the internal component elements. A wind directing hood 10, the flow guiding hood 8 and the mainboard 11 are provided inside the housing 9. The mainboard 11 of the heat dissipating device generally has two parts, i.e., a first mainboard region 12 and a second mainboard region 13. The front-placed air duct 1 is formed between the first mainboard region 12 on one hand and the wind directing hood 10 and the housing 9 on the other hand, and the heat dissipating gas flow generated by the fan member 17 firstly passes through the front-placed air duct 1. The rear-placed air duct 2 is formed between the second mainboard region 13 on one hand and the flow guiding hood 8 and the housing 9 on the other hand, and the front-placed air duct 1 and the rear-placed air duct 2 are communicated. Therefore, the heat dissipating gas flow generated by the fan member 17 passes through the front-placed air duct 1 and subsequently passes through the rear-placed air duct 2. A plurality of first heat dissipating elements 4 and second heat dissipating elements 5 are provided within the first mainboard region 12, and the third heat dissipating element 7 is provided within the second mainboard region 13. In other words, the first heat dissipating elements 4 and the second heat dissipating elements 5 are located in the front-placed air duct 1 corresponding to the first mainboard region 12, and the third heat dissipating element 7 is located in the front-placed air duct 1 corresponding to the second mainboard region 13.

In an embodiment of the present application, the wind directing hood 10 comprises a top plate 14, a plurality of partition plates 15 are provided on the top plate 14, the front-placed air sub-ducts 3 are formed between two neighboring partition plates 15, and the blocking plates 6 are detachably mounted inside the front-placed air sub-ducts 3.

Figure 4:
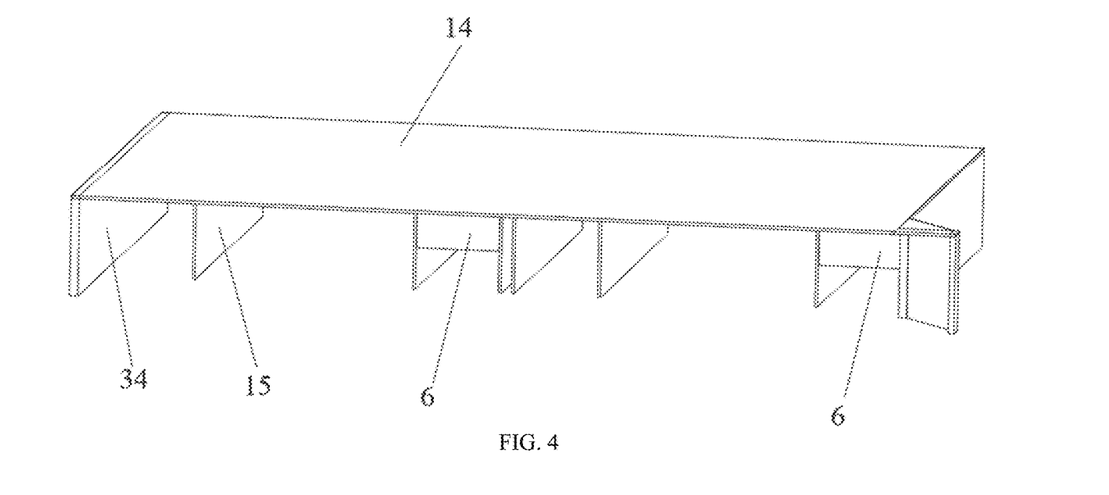
FIG. 4 is a first schematic structural diagram of the wind directing hood of a heat dissipating device according to some embodiments of the present application.
Figure 5:
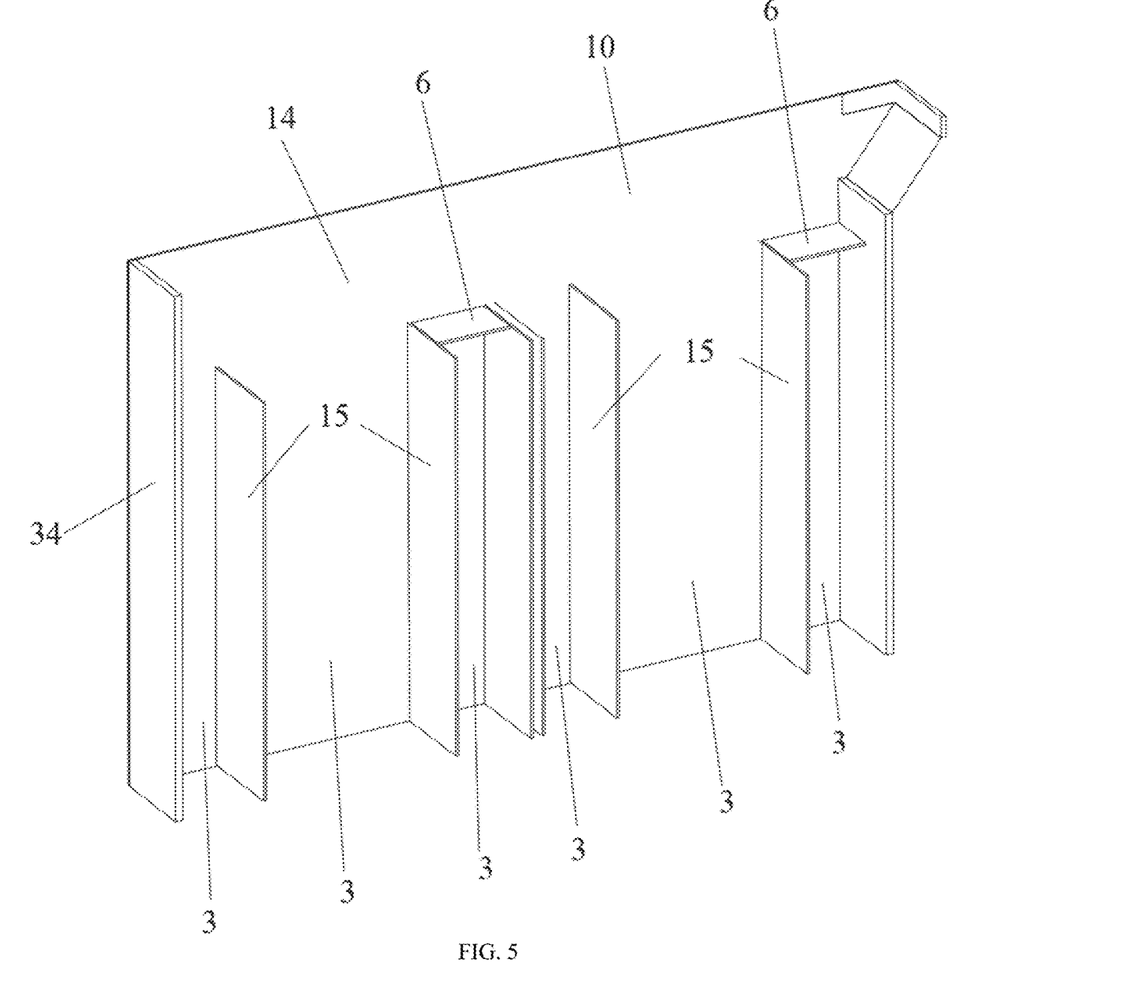
FIG. 5 is a second schematic structural diagram of the wind directing hood of a heat dissipating device according to some embodiments of the present application.
Figure 6:
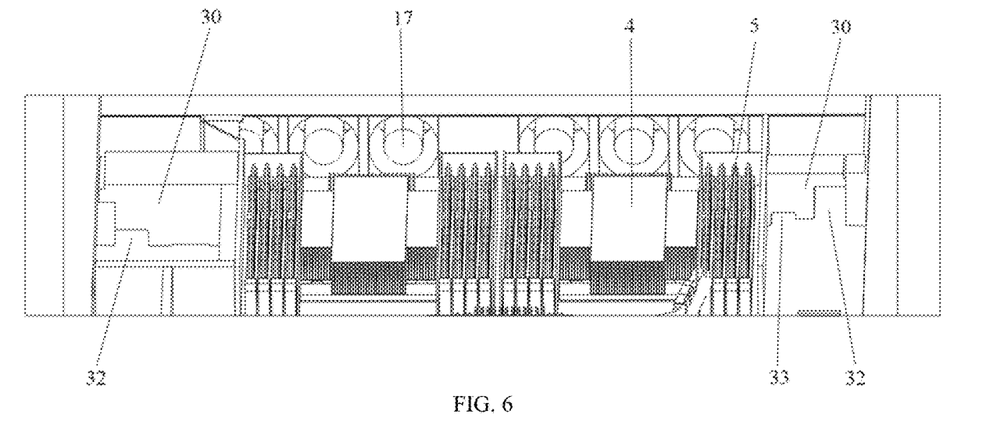
FIG. 6 is a schematic structural diagram of the foamed-plastic positions on the two sides of a heat dissipating device according to some embodiments of the present application.

As shown in FIGS. 4 and 5, the wind directing hood 10 comprises a top plate 14 and side plates 34. When the wind directing hood 10 is mounted to the heat dissipating device, the top plate 14 and the side plates 34 of the wind directing hood 10 and the first mainboard region 12 of the mainboard 11 form the front-placed air duct 1 therebetween. A plurality of partition plates 15 are provided between the two side plates 34 of the wind directing hood 10, two neighboring partition plates 15, the top plate 14 and the first mainboard region 12 of the mainboard 11 form the front-placed air sub-ducts 3 therebetween. Different heat dissipating elements are provided correspondingly inside the front-placed air sub-ducts 3. Further, the first heat dissipating element 4 and the second heat dissipating element 5 are located in different front-placed air sub-ducts 3. In comparison between the first heat dissipating element 4 and the second heat dissipating element 5, the heat-dissipation amount of the first heat dissipating element 4 is greater than the heat-dissipation amount of the second heat dissipating element 5. The blocking plate 6 is provided in the front-placed air sub-duct 3 where the second heat dissipating element 5 is located (as shown in the drawings, the front-placed air sub-duct 3 where the blocking plate 6 is provided is the front-placed air sub-duct 3 where the second heat dissipating element 5 is located), so as to reduce, by using the blocking plate 6, the magnitude of the heat dissipating gas flow within a unit time of the front-placed air sub-duct 3 where it is located, in the same one wind directing hood 10, the reduction of the magnitude of the heat dissipating gas flow passing through the second heat dissipating element 5 results in the increasing of the heat dissipating gas flow passing through the first heat dissipating element 4. Therefore, the provision of the blocking plate 6, in fact, reduces part of the heat-dissipation capacity for the second heat dissipating element 5, so as to relatively increase the heat-dissipation capacity for the first heat dissipating element 4, which, while ensuring satisfaction of the heat-dissipation demand of the second heat dissipating element 5, coordinately optimizes the heat-dissipation capacity of the entire heat dissipating device, whereby all of the component elements in the heat dissipating device may be within the design standards, to satisfy the demands of the users. In an embodiment of the present application, the blocking plate 6 is provided on the side of the front-placed air sub-duct 3 that is closer to the fan member 17, wherein that side is the air inlet where the heat dissipating gas flow generated by the fan member 17 enters the front-placed air duct 1, and the other side is the air outlet after the heat dissipating gas flow flows through the front-placed air sub-duct 3. The heat dissipating gas flow flowing out of the air outlet passes through the flow guiding hood 8 and enters the rear-placed air duct 2.

In an embodiment of the present application, the blocking plate 6 is connected to the top plate 14, and/or the blocking plate 6 is connected to the partition plates 15 on the two sides of the front-placed air sub-duct 3 corresponding thereto.

In comparison between the first heat dissipating element 4 and the second heat dissipating element 5, the first heat dissipating element 4 has a higher heat-dissipation demand, and the second heat dissipating element 5 has a lower heat-dissipation demand. Therefore, the heat-dissipation capacity for the first heat dissipating element 4 may be increased by compromising the heat-dissipation capacity for the second heat dissipating element 5. Therefore, the blocking plate 6 is provided in the front-placed air sub-duct 3 where the corresponding second heat dissipating element 5 is located, for example, the blocking plate 6 shown in FIGS. 4 and 5. The blocking plate 6 has three types of the mode of connection in the front-placed air sub-duct 3 where it is located, wherein the first type is that the blocking plate 6 is connected to the top plate 14, the second type is that the blocking plate 6 is connected to the partition plate 15, and the third type is that the blocking plate 6 is connected to both of the partition plate 15 and the side plate 34. In order to facilitate to replace the blocking plates 6 of different specifications, the blocking plate 6 is detachably connected to the partition plate 15 and the side plate 34. Further, the blocking plate 6 is connected to the partition plate 15 and the side plate 34 by interference fitting. Sliding grooves are provided on the top plate 14, the partition plate 15 and the side plate 34, the edges of the blocking plate 6 are inserted into the sliding grooves, and the edges of the blocking plate 6 and the sliding grooves are interference-fitted, to prevent the blocking plate 6 from moving in the sliding grooves due to the blowing by the heat dissipating gas flow. The interference-fitting amount between the blocking plate 6 and the sliding grooves allows the user to mount the blocking plate 6 into the sliding grooves, and allows the user to move the blocking plate 6 out of the sliding grooves. In an embodiment of the present application, as shown in the figures, sliding grooves are provided between two neighboring partition plates 15, the sliding grooves are in the downward direction perpendicular to the direction of the heat dissipating gas flow (in the vertical downward direction), the two ends of the blocking plate 6 are inserted into the sliding grooves, and blocking plates are provided at the bottoms of the sliding grooves to limit the blocking plate 6.

In an embodiment of the present application, a plurality of fourth heat dissipating elements 16 are provided within the second mainboard region 13, the fourth heat dissipating elements 16 are located in the rear-placed air duct 2, and the fourth heat dissipating elements 16 correspond to at least one of the front-placed air sub-ducts 3.

The first heat dissipating element 4 and the second heat dissipating element 5 are provided within the first mainboard region 12. Within the second mainboard region 13 not only the third heat dissipating element 7 is provided, but also the fourth heat dissipating elements 16 are provided. The rear-placed air duct 2 is formed between the second mainboard region 13 on one hand and the flow guiding hood 8 and the housing 9 on the other hand, and therefore the fourth heat dissipating elements 16 are provided in the rear-placed air duct 2. Furthermore, the fourth heat dissipating elements 16 correspond to at least one of the front-placed air sub-ducts 3, so that the heat dissipating gas flow of the front-placed air duct 1 flows into the rear-placed air duct 2 to perform heat dissipation to the fourth heat dissipating elements located in the rear-placed air duct 2.

In an embodiment of the present application, the specification of the blocking plate 6 is decided according to the heat-dissipation demand of the fourth heat dissipating elements 16.

In order to further increase the efficiency of blocking of the blocking plate 6, the blocking plate 6 is provided with different specifications, wherein the blocking plates 6 of different specifications have unequal cross-sectional areas inside the corresponding front-placed air sub-ducts 3, and the unequal cross-sectional areas have different effects of blocking of the heat dissipating gas flows. Further, the blocking plate 6 having a higher cross-sectional area, inside the same one front-placed air sub-duct 3, has a higher resistance to the heat dissipating gas flow, and the blocking plate 6 having a lower cross-sectional area, inside the same one front-placed air sub-duct 3, has a lower resistance to the heat dissipating gas flow. Therefore, the blocking plates 6 of unequal cross-sectional areas may be provided to regulate the flow resistances by the blocking plates 6 to the heat dissipating gas flows inside the front-placed air sub-ducts 3 where the blocking plates 6 are located. In the heat dissipating device shown in FIG. 2, the left side is the first mainboard region 12, and the right side is the second mainboard region 13. The first heat dissipating element 4 and the second heat dissipating element 5 are provided within the first mainboard region 12. The first heat dissipating element 4 and the second heat dissipating element 5 are separate. The third heat dissipating element 7 and the fourth heat dissipating elements 16 are provided within the second mainboard region 13, the third heat dissipating element 7 is located at the upper part of the second mainboard region 13, and the third heat dissipating element 7 is located at the lower part of the second mainboard region 13. The fan member 17 is on the left of the first mainboard region 12, the heat dissipating gas flow generated by the fan member 17 passes through the front-placed air duct 1 to perform heat dissipation to the first heat dissipating element 4 and the second heat dissipating element 5 within the first mainboard region 12, and the heat dissipating gas flow flowing out of the front-placed air duct 1 enters the rear-placed air duct 2 to perform heat dissipation to the third heat dissipating element 7 and the fourth heat dissipating elements 16 in the rear-placed air duct 2. When the corresponding blocking plate 6 is provided in the front-placed air duct 1, because the blocking plate 6 blocks the heat dissipating gas flow inside the front-placed air sub-duct 3 where it is located, it influences the effect of heat dissipation of the fourth heat dissipating elements 16 located downstream of the front-placed air sub-duct 3 where the blocking plate 6 is located. Therefore, the size of the blocking plate 6 is required to be decided according to the heat-dissipation demand of the fourth heat dissipating elements 16. If the fourth heat dissipating elements 16 do not have a high heat-dissipation demand, then the blocking plate 6 of a larger cross-sectional area may be selected. If the fourth heat dissipating elements 16 have a relatively high heat-dissipation demand, then the blocking plate 6 of a smaller cross-sectional area may be selected. It is required to decide the size of the blocking plate 6 according to the experimentation data and empirical values. It is required to quantize the heat-dissipation demand of the fourth heat dissipating elements 16 according to a certain standard, and properly set the correspondence relation between the heat-dissipation demands and the cross-sectional areas of the blocking plate 6, so as to reasonably select the magnitude of the cross-sectional area of the blocking plate 6 according to the heat-dissipation demand of the fourth heat dissipating elements 16.

In an embodiment of the present application, the installation position of the blocking plate 6 is decided according to the positions of the fourth heat dissipating elements 16 in the rear-placed air duct 2.

After the magnitude of the cross-sectional area of the blocking plate 6 has been reasonably selected according to the heat-dissipation demand of the fourth heat dissipating elements 16, it is required to determine the installation position of the blocking plate 6. A plurality of front-placed air sub-ducts 3 might exist that correspond to the fourth heat dissipating elements 16, and it is required to select the front-placed air sub-duct 3 that is closest to the fourth heat dissipating elements 16 to mount the blocking plate 6. As a result, even though the blocking plate 6, after mounted, compromises the heat-dissipation capacity for the second heat dissipating element 5, its remaining heat-dissipation capacity may still satisfy the heat-dissipation demand of the fourth heat dissipating elements 16 located in the rear-placed air duct 2 downstream of the front-placed air duct 1. Therefore, the fourth heat dissipating elements 16 are the component elements that do not have a high requirement on heat dissipation within the second mainboard region 13.

In an embodiment of the present application, the first heat dissipating elements 4 are central processing units, the second heat dissipating elements 5 are memory bars, and the blocking plate 6 is provided inside the front-placed air sub-duct 3 corresponding to at least one of the memory bars.

The first heat dissipating elements 4 are central processing units, the second heat dissipating elements 5 are memory bars, and the blocking plate 6 is provided inside the front-placed air sub-duct 3 corresponding to at least one of the memory bars. The heat-dissipation amount of the central processing unit is greater than the heat-dissipation amount of the memory bar. The blocking plate 6 is provided in the front-placed air sub-duct 3 where the memory bar is located, so as to reduce, by using the blocking plate 6, the magnitude of the heat dissipating gas flow within a unit time of the front-placed air sub-duct 3 where it is located, in the same one wind directing hood 10, the reduction of the magnitude of the heat dissipating gas flow passing through the memory bar results in the increasing of the heat dissipating gas flow passing through the central processing unit. Therefore, the provision of the blocking plate 6, in fact, reduces part of the heat-dissipation capacity for the memory bar, so as to relatively increase the heat-dissipation capacity for the central processing unit, which, while ensuring satisfaction of the heat-dissipation demand of the memory bar, coordinately optimizes the heat-dissipation capacity of the entire heat dissipating device, whereby all of the component elements in the heat dissipating device may be within the design standards, to satisfy the demands of the users.

In an embodiment of the present application, the third heat dissipating element 7 is a power-supply module, and the fourth heat dissipating elements 16 are a south-bridge chip and an M.2 interface device.

The third heat dissipating element 7 is provided within the second mainboard region 13. The third heat dissipating element 7 is the power-supply module, and the power-supply module is located in the rear-placed air duct 2. After the heat dissipating gas flow generated by the fan member 17 has passed through the front-placed air duct 1, the temperature of the heat dissipating gas flow has been increased, and the heat dissipating gas flow entering the rear-placed air duct 2 has already had a certain temperature. Therefore, in the related art, the heat-dissipation capacity for the power-supply module by the heat dissipating gas flow passing through the rear-placed air duct 2 cannot satisfy the heat-dissipation demand of the power-supply module. Therefore, the flow guiding hood 8 is provided between the front-placed air duct 1 and the rear-placed air duct 2, and the path of the heat dissipating gas flow of the front-placed air duct 1 and the rear-placed air duct 2 and the magnitude of the heat dissipating gas flow passing through that path are reasonably coordinately planned by using the flow guiding hood 8, so as to increase the heat-dissipation capacity of the heat dissipating gas flow for the power-supply module located in the rear-placed air duct 2, to satisfy the heat-dissipation demand of the power-supply module. Both of the specification and the installation position of the blocking plate 6 are required to be determined according to the fourth heat dissipating elements 16. The fourth heat dissipating elements 16 are the component elements that do not have a high requirement on heat dissipation within the second mainboard region 13, for example, the south-bridge chip and an M.2 interface device.

In an embodiment of the present application, the heat dissipating device further comprises the fan member 17, the heat dissipating gas flow generated by the fan member 17 flows into the front-placed air duct 1, and the first air sub-duct 18, the second air sub-duct 19 and the third air sub-duct 20 in the front-placed air duct 1 correspond to the power-supply module.

Figure 1:
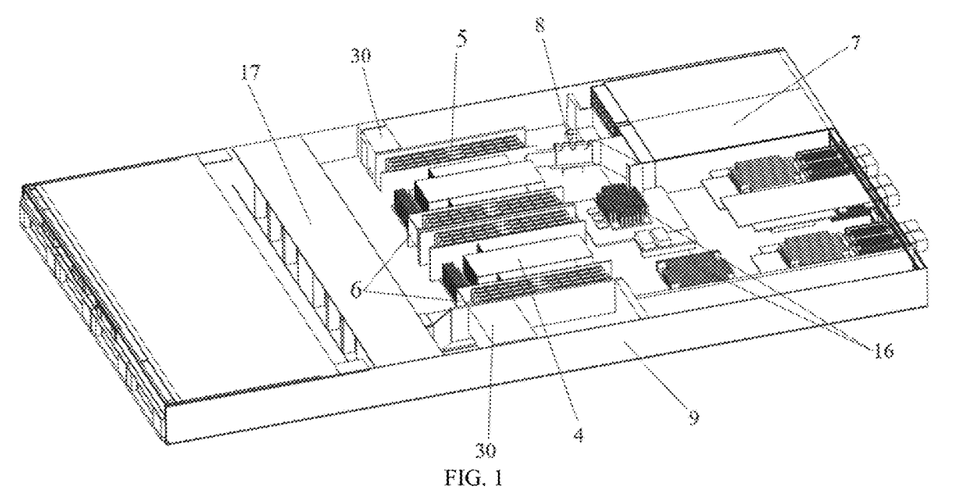
FIG. 1 is a schematic perspective structural diagram of a heat dissipating device according to some embodiments of the present application, wherein the housing has been removed.
Figure 2:
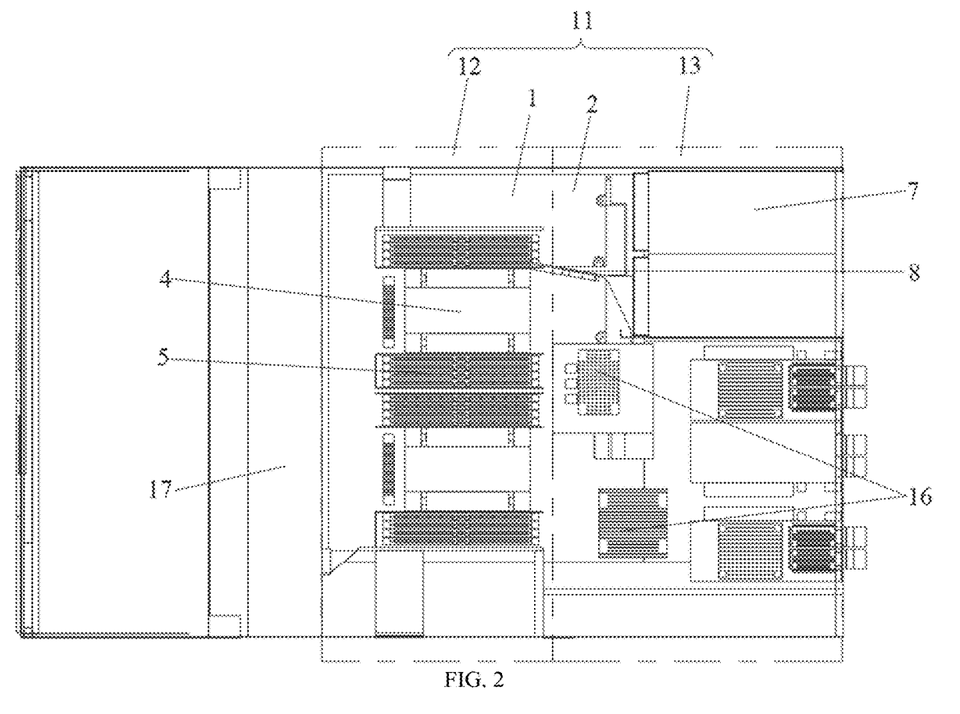
FIG. 2 is a schematic top structural diagram of a heat dissipating device according to some embodiments of the present application, wherein the housing has been removed.
Figure 3:
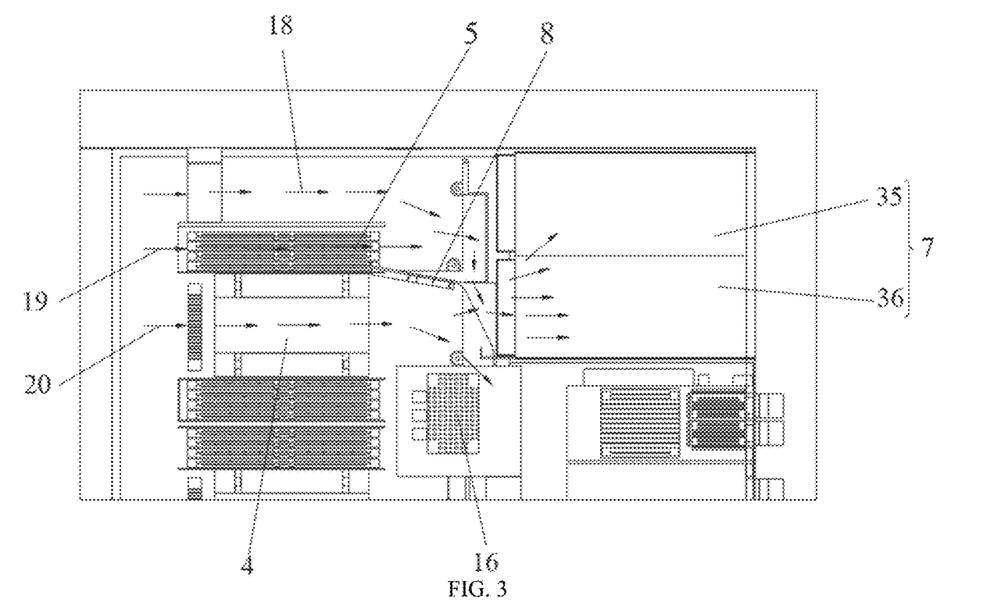
FIG. 3 is a schematic path diagram of the flowing paths of the heat dissipating gas flows in front of and behind the flow guiding hood of a heat dissipating device according to some embodiments of the present application.

In order to be capable of coordinately optimizing the heat dissipation by the heat dissipating device, to ensure that, when the internal component elements of the heat dissipating device are normally operating, the temperatures of all of them may be within the standards, it is required to further plan the paths of the heat dissipating gas flows of the front-placed air duct 1 and the rear-placed air duct 2. Regarding the path planning of the front-placed air duct 1, the front-placed air sub-ducts 3 that are closest to the third heat dissipating element 7 are the first air sub-duct 18, the second air sub-duct 19 and the third air sub-duct 20, and the path planning to the three air sub-ducts improves the capacity of the coordinated controlling over the heat dissipation by the heat dissipating device. In the heat-dissipation controlling over power-supply modules in the related art, the wind of the front-placed air duct 1 (the heat dissipating gas flow passing through the memory bar and/or the central processing unit) directly enters the two power-supply modules in the rear-placed air duct 2, and there is always one power-supply module whose temperature value cannot be controlled within the standard (for example, the power-supply module that is closer to the central processing unit in FIG. 2). That is because the heat dissipating gas flow that has passed through the central processing unit has a high temperature rise, and the heat dissipating gas flow that has passed through the central processing unit cannot satisfy the heat-dissipation demand of the power-supply module downstream thereof. The power-supply module comprises the first power-supply module 35 and the second power-supply module 36, as shown in FIG. 3. By the reasonable planning to the first air sub-duct 18, the second air sub-duct 19 and the third air sub-duct 20, finally the temperature of the heat dissipating gas flow that passes through the front-placed air duct 1 (the first air sub-duct 18, the second air sub-duct 19 and the third air sub-duct 20) and enters the rear-placed air duct 2 (goes to the power-supply module) is reduced. The first air sub-duct 18, the second air sub-duct 19 and the third air sub-duct 20 correspond to the power-supply module, whereby it may be ensured that, when the first power-supply module 35 and the second power-supply module 36 are normally operating, their temperatures are within the standard.

In an embodiment of the present application, the flow guiding plate 21 and the flow directing plate 22 are hinged.

Figure 7:
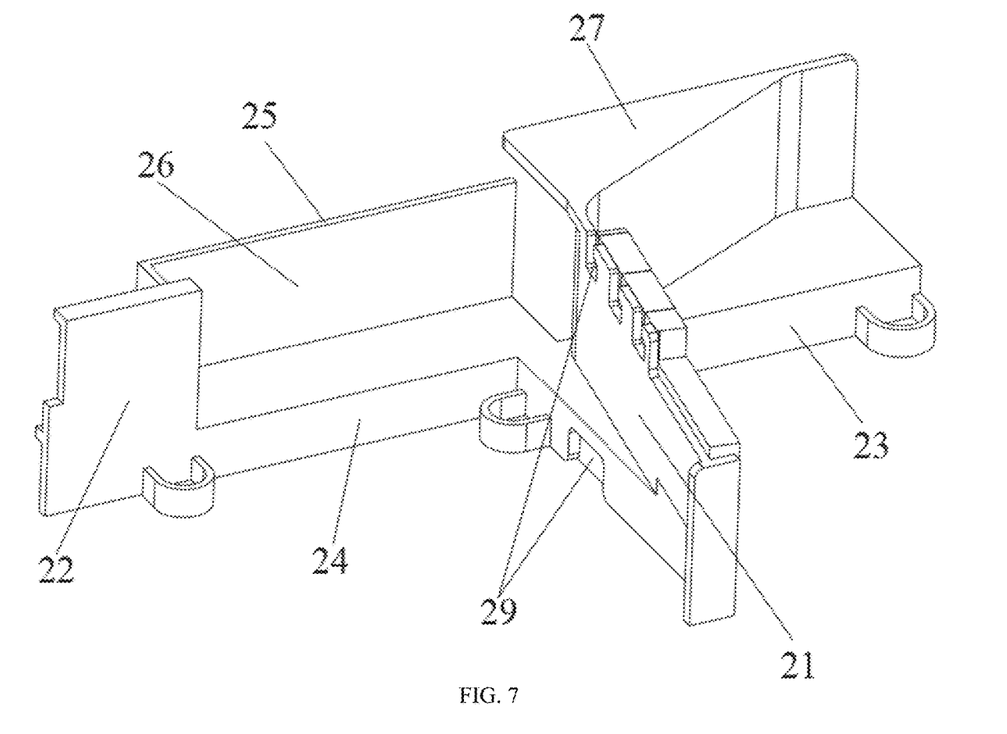
FIG. 7 is a first schematic structural diagram of the flow guiding hood of a heat dissipating device according to some embodiments of the present application.
Figure 8:
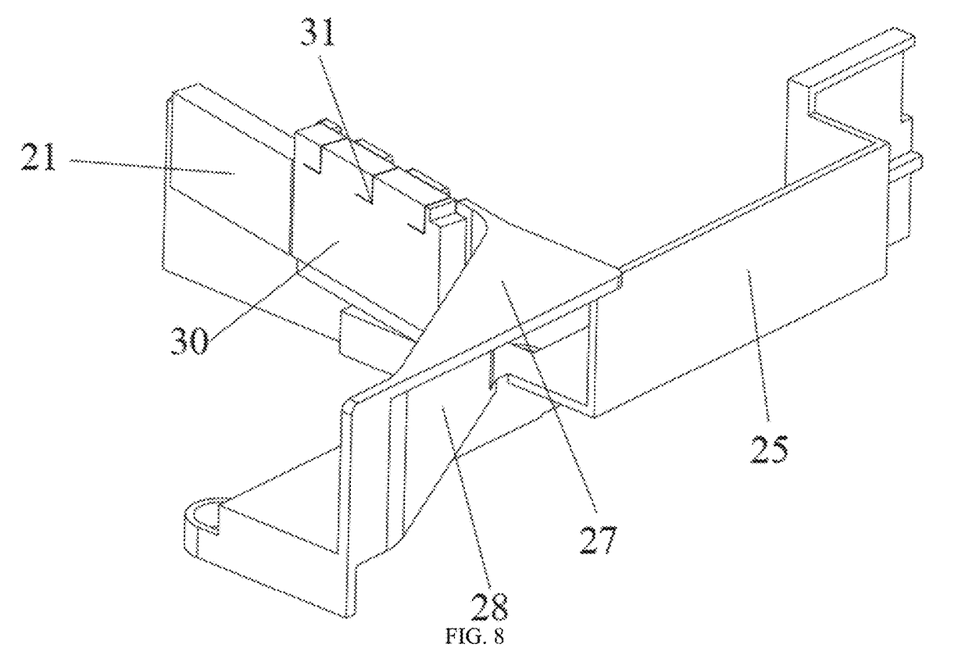
FIG. 8 is a second schematic structural diagram of the flow guiding hood of a heat dissipating device according to some embodiments of the present application.

The flow guiding hood 8 comprises the flow guiding plate 21 and the flow directing plate 22, as shown in FIGS. 7 and 8. The flow guiding plate 21 serves to guide the heat dissipating gas flows of the first air sub-duct 18, the second air sub-duct 19 and the third air sub-duct 20. The flow directing plate 22 serves to direct the heat dissipating gas flow that has been guided by the flow guiding plate 21. In order to facilitate to adjust the capacity of flow guiding of the flow guiding plate 21, the flow guiding plate 21 and the flow directing plate 22 are configured as hinged (not shown in FIGS. 7 and 8), wherein the flow directing plate 22 is fixed, and the flow guiding plate 21 may perform rotary movement with respect to the flow directing plate 22, whereby the capacity of flow guiding of the flow guiding plate 21 may be regulated by adjusting the rotation angle of the flow guiding plate 21 relative to the flow directing plate 22. Further, the main function of the flow guiding plate 21 is to converge the heat dissipating gas flows of the first air sub-duct 18 and the second air sub-duct 19, and divert in proportion the heat dissipating gas flow obtained by the convergence of the first air sub-duct 18 and the second air sub-duct 19 and the heat dissipating gas flow of the third air sub-duct 20, as shown by the schematic diagram of the flowing paths of the heat dissipating gas flows in front of and behind the flow guiding hood 8 in FIG. 3. If the flow guiding plate 21 is rotated in the direction toward the CPU, then it allows part of the high-temperature gas flows that have passed through the CPU to be converged by the first air sub-duct 18 and the second air sub-duct 19 and flow toward the third heat dissipating element 7 together, which reduces the temperature of the heat dissipating gas flow flowing toward the fourth heat dissipating elements 16, and increases the temperature of the heat dissipating gas flow flowing toward the third heat dissipating element 7. If the flow guiding plate 21 is rotated in the direction away from the CPU, then nearly all of the high-temperature gas flows that have passed through the CPU pass through the third air sub-duct 20 and flow toward the fourth heat dissipating elements 16, which reduces the temperature of the heat dissipating gas flow flowing toward the third heat dissipating element 7, and increases the temperature of the heat dissipating gas flow flowing toward the fourth heat dissipating elements 16. The flowing paths of the heat dissipating gas flows may be regulated by using the flow guiding plate 21, to increase the coordinated heat-dissipation capacity of the heat dissipating device.

In an embodiment of the present application, a center line is formed between the second air sub-duct 19 and the third air sub-duct 20, and the flow guiding plate 21 is located in the center line.

The memory bar is provided correspondingly inside the second air sub-duct 19, and what is provided correspondingly inside the first air sub-duct 18 is a heat dissipating element whose heat-dissipation amount is much less than the heat-dissipation amount of the memory bar. Therefore, after the heat dissipating gas flow inside the second air sub-duct 19 has flowed through the memory bar, as compared with the heat dissipating gas flow flowing through the heat dissipating element inside the first air sub-duct 18, the temperature of the heat dissipating gas flow flowing out of the second air sub-duct 19 is greater than the temperature of the heat dissipating gas flow flowing out of the first air sub-duct 18. Therefore, the first heat dissipating gas flow reduces the temperature of the second heat dissipating gas flow. However, what is provided correspondingly inside the third air sub-duct 20 is the CPU, and the heat-dissipation amount of the CPU is much greater than the heat-dissipation amount of the memory bar.

Therefore, the temperature of the heat dissipating gas flow flowing out of the third air sub-duct 20 is much greater than the temperatures of the heat dissipating gas flows flowing out of the first air sub-duct 18 and the second air sub-duct 19, and it is required to isolate the converged flow of the first air sub-duct 18 and the second air sub-duct 19 from the heat dissipating gas flow of the third air sub-duct 20, which is realized by using the flow guiding plate 21 of the wind directing hood 10. When the rotation angle of the flow guiding plate 21 is adjusted according to the practical situation of the heat dissipation, a preferable rotation position of the flow guiding plate 21 is where the end of the flow guiding plate 21 that is closer to the memory bar and the CPU is located in the center line formed between the second air sub-duct 19 and the third air sub-duct 20, which may effectively isolate the converged flow of the first air sub-duct 18 and the second air sub-duct 19 from the heat dissipating gas flow of the third air sub-duct 20, thereby effectively reducing the temperature of the heat dissipating gas flow flowing toward the third heat dissipating element 7 (the power-supply module).

In an embodiment of the present application, the flow directing partition plate 23 and the flow directing through plate 24 are located on the two sides of the flow guiding plate 21, the flow directing partition plate 23 is located on the side corresponding to the third air sub-duct 20, and the flow directing through plate 24 is located on the side corresponding to the first air sub-duct 18 and the second air sub-duct 19.

The flow directing plate 22 comprises the flow directing partition plate 23 and the flow directing through plate 24, as shown in FIG. 7. The flow directing partition plate 23 serves to block the heat dissipating gas flows. The flow directing through plate 24 serves to permit the heat dissipating gas flows to pass through, and, after the heat dissipating gas flows of the first air sub-duct 18 and the second air sub-duct 19 have passed through the flow directing through plate 24, the heat dissipating gas flow of the first air sub-duct 18 and the heat dissipating gas flow of the second air sub-duct 19 are effectively converged. Because a preferable position of the flow guiding plate 21 is where the end of the flow guiding plate 21 that is closer to the memory bar and the CPU is located in the center line formed between the second air sub-duct 19 and the third air sub-duct 20, the flow directing partition plate 23 and the flow directing through plate 24 are located on the two sides of the flow guiding plate 21, the flow directing through plate 24 corresponds to the positions of the first air sub-duct 18 and the second air sub-duct 19, and the flow directing partition plate 23 corresponds to the position of the third air sub-duct 20, which may effectively isolate the converged flow of the first air sub-duct 18 and the second air sub-duct 19 from the heat dissipating gas flow of the third air sub-duct 20, thereby effectively reducing the temperature of the heat dissipating gas flow flowing toward the third heat dissipating element 7 (the power-supply module).

In an embodiment of the present application, a first guide plate 25 is provided on the side of the flow directing through plate 24 that is opposite to the flow guiding plate 21, and a first flow directing groove 26 for changing the direction of the heat dissipating gas flow is formed between the first guide plate 25 and the flow directing through plate 24.

In order to improve the effect of the convergence of the heat dissipating gas flows of the first air sub-duct 18 and the second air sub-duct 19, the first guide plate 25 is provided on the side of the flow directing through plate 24 that is opposite to the flow guiding plate 21, and the first flow directing groove 26 for changing the direction of the heat dissipating gas flow is formed between the first guide plate 25 and the flow directing through plate 24. The first flow directing groove 26 changes the direction of the converged flow of the heat dissipating gas flows of the first air sub-duct 18 and the second air sub-duct 19, which effectively mixes the heat dissipating gas flows of the first air sub-duct 18 and the second air sub-duct 19, so as to cool the heat dissipating gas flow of the second air sub-duct 19 by using the heat dissipating gas flow of the first air sub-duct 18.

In an embodiment of the present application, a second guide plate 27 is provided on the side of the flow directing partition plate 23 that is opposite to the flow guiding plate 21, and a second flow directing groove 28 for changing the direction of the heat dissipating gas flow is formed between the second guide plate 27 and the flow directing partition plate 23.

The second guide plate 27 is provided on the side of the flow directing partition plate 23 that is opposite to the flow guiding plate 21, the second flow directing groove 28 is formed between the second guide plate 27 and the flow directing partition plate 23, and the second flow directing groove 28 is used for changing the direction of the heat dissipating gas flow.

In an embodiment of the present application, the second flow directing groove 28 and the first flow directing groove 26 are communicated.

The second flow directing groove 28 and the first flow directing groove 26 are communicated, and therefore the heat dissipating gas flow that has flowed through the first flow directing groove 26 flows toward the second flow directing groove 28, as shown in FIGS. 7 and 8 (FIGS. 7 and 8 do not identify the housing 9, and the housing 9 and the flow guiding hood 8 form the flowing channel of the heat dissipating gas flow). After the first flow directing groove 26 has changed the direction of the converged flow of the heat dissipating gas flows of the first air sub-duct 18 and the second air sub-duct 19, the second flow directing groove 28 changes the direction of the converged flow again, so that the heat dissipating gas flow that has flowed through the second flow directing groove 28 flows toward the third heat dissipating element 7 (the power-supply module), whereby the converged flow of the heat dissipating gas flows of the first air sub-duct 18 and the second air sub-duct 19 effectively performs the heat dissipation to the third heat dissipating element 7.

In an embodiment of the present application, cable raceways 29 are provided at the top and the bottom of the flow guiding plate 21.

In the related art, wiring is required between the front-placed air duct 1 and the rear-placed air duct 2. However, the harness provided between the front-placed air duct 1 and the rear-placed air duct 2 hinders the heat dissipating gas flow flowing from the front-placed air duct 1 toward the rear-placed air duct 2, which affects the effect of heat dissipation of the third heat dissipating element 7 by the heat dissipating gas flow in the rear-placed air duct 2. Therefore, in the present application, the flow guiding hood 8 is provided between the front-placed air duct 1 and the rear-placed air duct 2, which cannot only converge and divert the heat dissipating gas flows, but also can be used for the wiring of the harness, whereby the harness is wired via the cable raceways 29 at the top and the bottom of the flow guiding hood 8, to reduce the blocking to the heat dissipating gas flows by the harness, and increase the effect of heat dissipation to the third heat dissipating element 7.

In an embodiment of the present application, foamed plastics 30 are provided at the cable raceways 29, and threading grooves 31 are provided on the foamed plastics 30.

Foamed plastics 30 are provided at the cable raceways 29, and the threading grooves 31 are provided on the foamed plastics 30. The harness is provided in the threading grooves 31 on the foamed plastics 30. The foamed plastics 30 serve to prevent air leakage, i.e., preventing losing of the heat dissipating gas flows.

In an embodiment of the present application, foamed plastics 30 are provided between the two sides of the wind directing hood 10 and the housing 9, each of the foamed plastics 30 is provided with a threading hole 32 and an avoiding hole 33, and the gaps of some of the threading holes 32 and the avoiding holes 33 form the first air sub-duct 18.

Foamed plastics 30 are provided between the two sides of the wind directing hood 10 and the housing 9, each of the foamed plastics 30 is provided with a threading hole 32 and an avoiding hole 33, and the gaps of some of the threading holes 32 and the avoiding holes 33 form the first air sub-duct 18. Here, the threading holes 32 in the foamed plastics 30 are used for threading. The avoiding holes 33 are used for avoiding the component elements under the foamed plastics 30. When the harness passes through the threading holes 32 gaps are left, and therefore gaps are left between the avoiding holes 33 and the component elements. The heat dissipating gas flow generated by the fan member 17 passes through two gaps to form the first air sub-duct 18, so as to converge the heat dissipating gas flow that has passed through the first air sub-duct 18 and the heat dissipating gas flow that has passed through the second air sub-duct 19, to further reduce the temperature of the heat dissipating gas flow of the second air sub-duct 19. The foamed plastic 30 located on the side of the first air sub-duct 18 may be separable, and the threading holes 32 are provided on the side closer to the housing 9, which facilitates the wiring and may prevent the foamed plastic 30 from pressing the wires. The foamed plastic 30 on the other side of the wind directing hood 10 may also be separable, which, while facilitating the wiring, may prevent air leakage of the heat dissipating gas flow at that position, i.e., preventing losing of the heat dissipating gas flows.

The Second Embodiment

Figure 9:
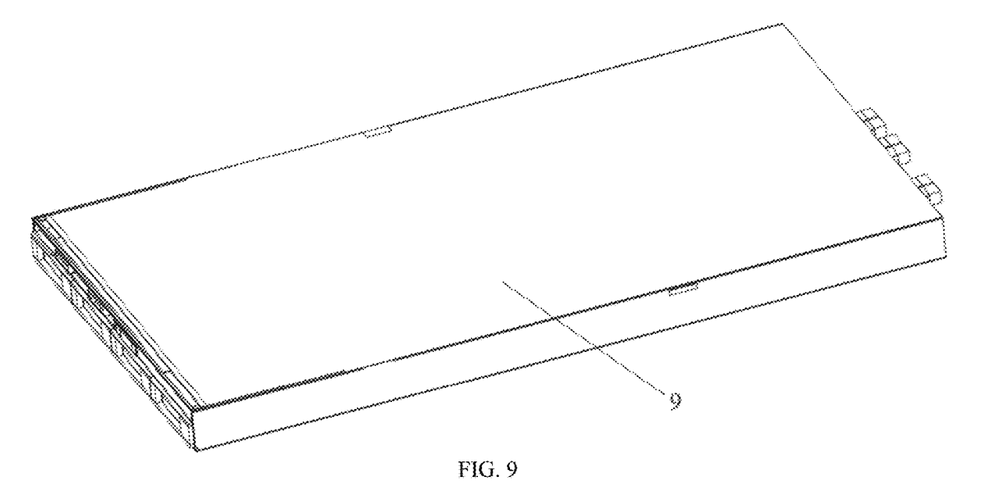
FIG. 9 is a schematic structural diagram of a server according to some embodiments of the present application.

Referring to FIG. 9, FIG. 9 is a schematic structural diagram of a server according to some embodiments of the present application. The contents of the server shown in FIG. 9 that are the same as or similar to those in the schematic structural diagrams shown in FIGS. 1-8 may refer to the structures in FIGS. 1-8, and are not discussed further herein.

The server comprises the heat dissipating device stated above, which may coordinately plan the path of the front-placed air duct 1 and the rear-placed air duct 2 and the magnitude of the gas flow flowing through the front-placed air duct 1 and the rear-placed air duct 2. Firstly, the blocking plate 6 is provided in the front-placed air sub-duct 3 corresponding to the second heat dissipating element 5, so as to relatively increase the heat-dissipation capacity for the first heat dissipating element 4 by compromising the heat-dissipation capacity for the second heat dissipating element 5, which coordinately optimizes the heat-dissipation capacity of the front-placed air duct 1. The flow guiding hood 8 is provided between the front-placed air duct 1 and the rear-placed air duct 2, and the flow guiding hood 8 effectively converges and diverts the heat dissipating gas flow entering the rear-placed air duct 2 from the front-placed air duct 1, which coordinately optimizes the heat-dissipation capacity of the rear-placed air duct 2. The coordinated planning of the path of the front-placed air duct 1 and the rear-placed air duct 2 and the magnitude of the gas flow flowing through the front-placed air duct 1 and the rear-placed air duct 2 reduces the temperature of the third heat dissipating element 7 overall, and effectively increases the overall coordinated heat-dissipation capacity for the server.

The technical features of the above embodiments may be combined randomly. In order to simplify the description, all of the feasible combinations of the technical features of the above embodiments are not described. However, as long as the combinations of those technical features are not contradictory, they should be considered as falling within the scope of the description.

The above embodiments merely describe some embodiments of the present application, and although they are described particularly and in detail, they cannot be accordingly understood as limiting the patent scope of the present disclosure. It should be noted that a person skilled in the art may make variations and improvements without departing from the concept of the present application, all of which fall within the protection scope of the present application. Therefore, the patent protection scope of the present application should be subject to the appended claims.

The invention claimed is:

1. A heat dissipating device, wherein the heat dissipating device comprises a front-placed air duct and a rear-placed air duct that are sequentially arranged in a direction of a heat dissipating gas flow of the heat dissipating device, and the rear-placed air duct and the front-placed air duct are communicated;

the front-placed air duct comprises a plurality of front-placed air sub-ducts, a plurality of first heat dissipating elements and second heat dissipating elements are provided inside the front-placed air duct, the first heat dissipating elements and the second heat dissipating elements are located in different instances of the front-placed air sub-ducts, a heat-dissipation amount of the first heat dissipating elements within a unit time is greater than a heat-dissipation amount of the second heat dissipating elements within the unit time, a blocking plate is provided within the front-placed air sub-duct corresponding to at least one of the second heat dissipating elements, the blocking plate has different specifications, and the blocking plates of different specifications have unequal cross-sectional areas inside the corresponding front-placed air sub-ducts; and a third heat dissipating element is provided inside the rear-placed air duct, the front-placed air sub-ducts that are closest to the third heat dissipating element are a first air sub-duct, a second air sub-duct and a third air sub-duct, a flow guiding hood is provided between the first air sub-duct, the second air sub-duct and the third air sub-duct on one hand and the rear-placed air duct on the other hand, the flow guiding hood comprises a flow guiding plate and a flow directing plate, the flow directing plate comprises a flow directing partition plate and a flow directing through plate, the heat dissipating gas flows in the first air sub-duct and the second air sub-duct are converged by the flow guiding plate and subsequently flow toward the third heat dissipating element in the rear-placed air duct via the flow directing through plate, and the heat dissipating gas flow of the third air sub-duct passes through the flow guiding plate, is diverted by the first air sub-duct and the second air sub-duct, and subsequently leaves the third heat dissipating element via the flow directing partition plate.

2. The heat dissipating device according to claim 1, wherein the heat dissipating device further comprises a housing, a wind directing hood, a mainboard and the flow guiding hood are provided inside the housing, the mainboard comprises a first mainboard region and a second mainboard region, the front-placed air duct is formed between the first mainboard region on one hand and the wind directing hood and the housing on the other hand, the rear-placed air duct is formed between the second mainboard region on one hand and the flow guiding hood and the housing on the other hand, the plurality of first heat dissipating elements and second heat dissipating elements are provided within the first mainboard region, and the third heat dissipating element is provided within the second mainboard region.

3. The heat dissipating device according to claim 2, wherein the wind directing hood comprises a top plate, a plurality of partition plates are provided on the top plate, the front-placed air sub-ducts are formed between two neighboring instances of the partition plates, and the blocking plates are detachably mounted inside the front-placed air sub-ducts.

4. The heat dissipating device according to claim 3, wherein the blocking plate is connected to the top plate, and/or the blocking plate is connected to the partition plates on two sides of the front-placed air sub-duct corresponding thereto.

5. The heat dissipating device according to claim 2, wherein a plurality of fourth heat dissipating elements are provided within the second mainboard region, the fourth heat dissipating elements are located in the rear-placed air duct, and the fourth heat dissipating elements correspond to at least one of the front-placed air sub-ducts.

6. The heat dissipating device according to claim 5, wherein a specification of the blocking plate is decided according to a heat-dissipation demand of the fourth heat dissipating elements.

7. The heat dissipating device according to claim 6, wherein an installation position of the blocking plate is decided according to positions of the fourth heat dissipating elements in the rear-placed air duct.

8. The heat dissipating device according to claim 7, wherein the first heat dissipating elements are central processing units, the second heat dissipating elements are memory bars, and the blocking plate is provided inside the front-placed air sub-duct corresponding to at least one of the memory bars.

9. The heat dissipating device according to claim 8, wherein the third heat dissipating element is a power-supply module, and the fourth heat dissipating elements are a south-bridge chip and an interface device.

10. The heat dissipating device according to claim 9, wherein the heat dissipating device further comprises a fan member, a heat dissipating gas flow generated by the fan member flows into the front-placed air duct, and the first air sub-duct, the second air sub-duct and the third air sub-duct in the front-placed air duct correspond to the power-supply module.

11. The heat dissipating device according to claim 10, wherein the flow guiding plate and the flow directing plate are hinged.

12. The heat dissipating device according to claim 11, wherein a center line is formed between the second air sub-duct and the third air sub-duct, and the flow guiding plate is located in the center line.

13. The heat dissipating device according to claim 12, wherein the flow directing partition plate and the flow directing through plate are located on two sides of the flow guiding plate, the flow directing partition plate is located on one side corresponding to the third air sub-duct, and the flow directing through plate is located on one side corresponding to the first air sub-duct and the second air sub-duct.

14. The heat dissipating device according to claim 13, wherein a first guide plate is provided on one side of the flow directing through plate that is opposite to the flow guiding plate, and a first flow directing groove for changing the direction of the heat dissipating gas flow is formed between the first guide plate and the flow directing through plate.

15. The heat dissipating device according to claim 14, wherein a second guide plate is provided on one side of the flow directing partition plate that is opposite to the flow guiding plate, and a second flow directing groove for changing the direction of the heat dissipating gas flow is formed between the second guide plate and the flow directing partition plate.

16. The heat dissipating device according to claim 15, wherein the second flow directing groove and the first flow directing groove are communicated.

17. The heat dissipating device according to claim 16, wherein cable raceways are provided at a top and a bottom of the flow guiding plate.

18. The heat dissipating device according to claim 17, wherein foamed plastics are provided at the cable raceways, and threading grooves are provided on the foamed plastics.

19. The heat dissipating device according to claim 2, wherein foamed plastics are provided between two sides of the wind directing hood and the housing, each of the foamed plastics is provided with a threading hole and an avoiding hole, and gaps of some of the threading holes and the avoiding holes form the first air sub-duct).

20. A server, wherein the server comprises the heat dissipating device according to claim 1.

21. The heat dissipating device according to claim 3, wherein the wind directing hood further comprises side plates;

when the wind directing hood is mounted to the heat dissipating device, the top plate and the side plates of the wind directing hood and the first mainboard region of the mainboard form the front-placed air duct therebetween; and the partition plates are provided between the two instances of the side plates.

22. The heat dissipating device according to claim 21, wherein the blocking plate is detachably connected to one of the partition plates and one of the side plates; and the blocking plate is connected to the partition plate and the side plate by interference fitting.

23. The heat dissipating device according to claim 22, wherein sliding grooves are provided on the top plate, the partition plate and the side plate, edges of the blocking plate are inserted into the sliding grooves, and edges of the blocking plate and the sliding grooves are interference-fitted, to prevent the blocking plate from moving in the sliding grooves due to blowing by the heat dissipating gas flow.

* * * * *